United States Patent [19]

Kamuda

[11] Patent Number: 5,523,915
[45] Date of Patent: Jun. 4, 1996

[54] DATA STORAGE SYSTEM

[75] Inventor: Hirofumi Kamuda, Tachikawa, Japan

[73] Assignee: Casio Computer Co., Ltd., Tokyo, Japan

[21] Appl. No.: 283,998

[22] Filed: Aug. 1, 1994

[30] Foreign Application Priority Data

| Aug. 3, 1993 | [JP] | Japan | 5-192510 |
| Aug. 3, 1993 | [JP] | Japan | 5-192511 |
| Aug. 6, 1993 | [JP] | Japan | 5-195656 |
| Aug. 24, 1993 | [JP] | Japan | 5-209105 |

[51] Int. Cl.$^6$ .................................................. G11C 13/00
[52] U.S. Cl. ..................... 365/189.01; 365/94; 365/200; 365/230.01
[58] Field of Search ............. 365/94, 200, 230.01, 365/230.03, 230.06, 230.08, 189.04, 189.05, 189.01

[56] References Cited

U.S. PATENT DOCUMENTS 3,753,242  8/1973  Townsend .................................. 365/94

*Primary Examiner*—Terrell W. Fears
*Attorney, Agent, or Firm*—Frishauf, Holtz, Goodman, Langer & Chick

[57] ABSTRACT

A data storage system includes a data memory having a plurality of data storage areas for storing data together with preceding and succeeding data storage area address pointers. Normally, stored data are read out and displayed in a pointer sequence. In the event of data link disconnection caused by a pointer error, the stored data are read out in an address sequence in place of the pointer sequence, whereby the data can be reliably read out.

14 Claims, 15 Drawing Sheets

| ADDR. | TOP | BOTTOM | CUR. | FREE | | |
|---|---|---|---|---|---|---|
| 1 | | | | | | |
| 2 | 101 | 104 | 105 | 106 | | 0 |
| 3 | | | | | | |
| 4 | | | | | | |
| 100 | | | | | | |
| 101 | 104 | AIDA · · · · · | | | 102 | 10 |
| 102 | 101 | DAN · · · · · | | | 103 | 10 |
| 103 | 102 | KANEMARU · · | | | 105 | 10 |
| 104 | 105 | YAGASHITA · · | | | 101 | 10 |
| 105 | 103 | NAKANO · · · | | | 104 | 10 |
| 106 | | | | | | |
| 400 | | | | | | |
| 401 | | | | | | |

FIG.5

|     |     |     |     |     |     |     |
| --- | --- | --- | --- | --- | --- | --- |
| 1   |     |     |     |     |     |     |
| 2   | 101 | 104 | 105 | 106 |     | 1   |
| 3   |     |     |     |     |     |     |
| 4   |     |     |     |     |     |     |
| ~   |     |     |     |     |     |     |
| 100 |     |     |     |     |     |     |
| 101 | 104 | AIDA · · · |  |  | 102 | 10  |
| 102 | 101 | DXXX · · · |  |  | 1X  | X   |
| 103 | 102 | KANEMARU · |  |  | 105 | 10  |
| 104 | 105 | YAGASHITA · · |  |  | 101 | 10  |
| 105 | 103 | NAKANO · · |  |  | 104 | 10  |
| 106 |     |     |     |     |     |     |

FIG.7

| ADDR. | TOP | BOTTOM | CUR. | FREE | SPARE FREE | |
|---|---|---|---|---|---|---|
| 1 | | | | | | |
| 2 | 101 | 104 | 105 | 106 | 401 | }14 |
| 3 | | | | | | |
| 4 | | | | | | |
| 100 | | | | | | |
| 101 | 102 | 104 | AIDA · · · · | | 103 | |
| 102 | | | · · · · | | | |
| 103 | | 101 | KAMATA · · · | | 105 | |
| 104 | | 106 | YAGI · · · · | | 101 | }15 |
| 105 | | 103 | NAKANO · · · | | 106 | |
| 106 | | 105 | OGAWA · · · | | 104 | |
| 400 | | | | | | |
| 401 | | | | | | |

FIG.13

| ADDR. | TOP | BOTTOM | CUR. | FREE | SPARE FREE | |
|---|---|---|---|---|---|---|
| 1 | | | | | | |
| 2 | | | | | | |
| 3 | 101 | 104 | 106 | 103 | 401 | } 14 |
| 4 | | | | | | |
| 100 | | | | | | |
| 101 | 102 | 104 | AIDA · · · · · | | 103 | |
| 102 | | | · · · · · | | | |
| 103 | | | · · · · | | | |
| 104 | | 106 | YAGI · · · | | 101 | } 15 |
| 105 | | 103 | NAKANO · · · | | 106 | |
| 106 | | 105 | OGAWA · · · | | 104 | |
| 400 | | | | | | |
| 401 | | | | | | |

FIG.14

DATA STORAGE SYSTEM

BACKGROUND OF THE INVENTION

1. Field of the Invention

This invention relates to a data storage system for reading and displaying a plurality of stored data records in a predetermined sequence and, more particularly, to a data storage system using a non-volatile memory.

2. Description of the Prior Art

RAM (random access memory) is well known in the art as a data storage for storing many data records. In the RAM, however, the power source disconnection results in loss of the stored data. In order that the stored data remain when the power supply is cut, a non-volatile memory is used.

As a non-volatile memory, EEROM or the like is well known, which is capable of electrically writing and erasing data. At present, however, EEROM has a limited write repetition number. That is, when the writing is repeated for more than a predetermined number of times, no further data can be written in that area or erroneous data is written.

When it is desired to store a plurality of data records in a predetermined (e.g., alphabetical or numerical) sequence, data sorting is carried out such that those data records succeeding a new data record are moved to next storage locations while the new data record is placed at a free area thus made.

With this method, however, it is necessary to shift all data records succeeding a data record to be added. This increases a number of times of writing in the data storage areas. Therefore, the method is not suited to the EEROM or the like with a limited write repetition number.

To store ordered data records in the EEPROM, each data record is stored together with immediately preceding and succeeding, i.e., backward and forward data storage area address pointers specifying the address of next data to be read out.

With this method of data recording, it is necessary only to set the backward and forward pointers of a data record to be added and to update the forward pointer of the immediately preceding data record and the backward pointer of the immediately succeeding record. This minimizes the number of writing operations in the EEPROM.

However, in the event of the failure of such pointers, the data link disconnection occurs so that no further data records can be read out or displayed.

SUMMARY OF THE INVENTION

It is, therefore, an object of the invention to provide a data storage system capable of displaying the stored data records even in the event of data link disconnection.

Another object of the invention is to provide a data storage system capable of reducing data errors in a memory with a limited write repetition number.

A further object of the invention is to provide a data storage system capable of writing data records even if a write error occurs during the writing operation.

To attain the above objects of the invention, there is provided a data storage system, which comprises data storage means having a plurality of data storage areas for storing data together with backward and forward data storage area address pointers, first read control means for sequentially reading out data stored in the data storage area of the data storage means in accordance with the pointers, and second read control means for reading out the data stored in the data storage areas of the data storage means in a predetermined sequence.

With this arrangement, the data storage system can read out and display the stored data reliably even in the event of data link disconnection of the stored data.

BRIEF DESCRIPTION OF THE DRAWINGS

FIGS. 1 to 9 illustrate a first embodiment of the invention, in which;

FIG. 1 is a block diagram showing the hardware arrangement of the data storage system as the first embodiment of the invention;

FIG. 2 is a diagram showing a map of an EEPROM 5 shown in FIG. 1;

FIG. 3 is a flow chart showing a write-to-EEPROM routine executed by the data storage system of FIG. 1;

FIG. 4 shows a new data record in RAM 4 to be added to EEPROM 5;

FIG. 5 shows the map of EEPROM 5 after the addition of the data record shown in FIG. 4;

FIG. 6 is a flow chart showing a read-forward-from-EEPROM routine executed by the data storage system of FIG. 1;

FIG. 7 shows a map of EEPROM 5 with a data record error;

FIG. 8 is a diagram showing a data display sequence when normal data are stored in EEPROM 5; and FIG. 9 is a diagram showing a data display sequence when EEPROM 5 contains a data record error;

FIGS. 10 to 14 illustrate a second embodiment of the invention, in which:

FIG. 10 is a diagram showing an EEPROM map;

FIG. 11 is a flow chart showing a write-to-EEPROM routine executed by the second embodiment;

FIG. 12 is a diagram showing an example of data stored in the EEPROM;

FIG. 13 is a diagram showing EEPROM contents before updating; and

FIG. 14 is a view showing EEPROM contents after updating; and

FIGS. 15 to 17 illustrate a third embodiment of the invention, in which:

FIG. 15 is a diagram showing a storage map of EEPROM 5;

FIG. 16 is a diagram showing the configuration of a system field in EEPROM 5; and FIG. 17 is a diagram showing how a data record is written in a spare data storage area in the case of a write failure in regular data storage areas.

DETAILED DESCRIPTION OF THE PREFERRED EMBODIMENTS

Now, preferred embodiments of the invention will be described with reference to the drawings.

First Embodiment

Figure 1:
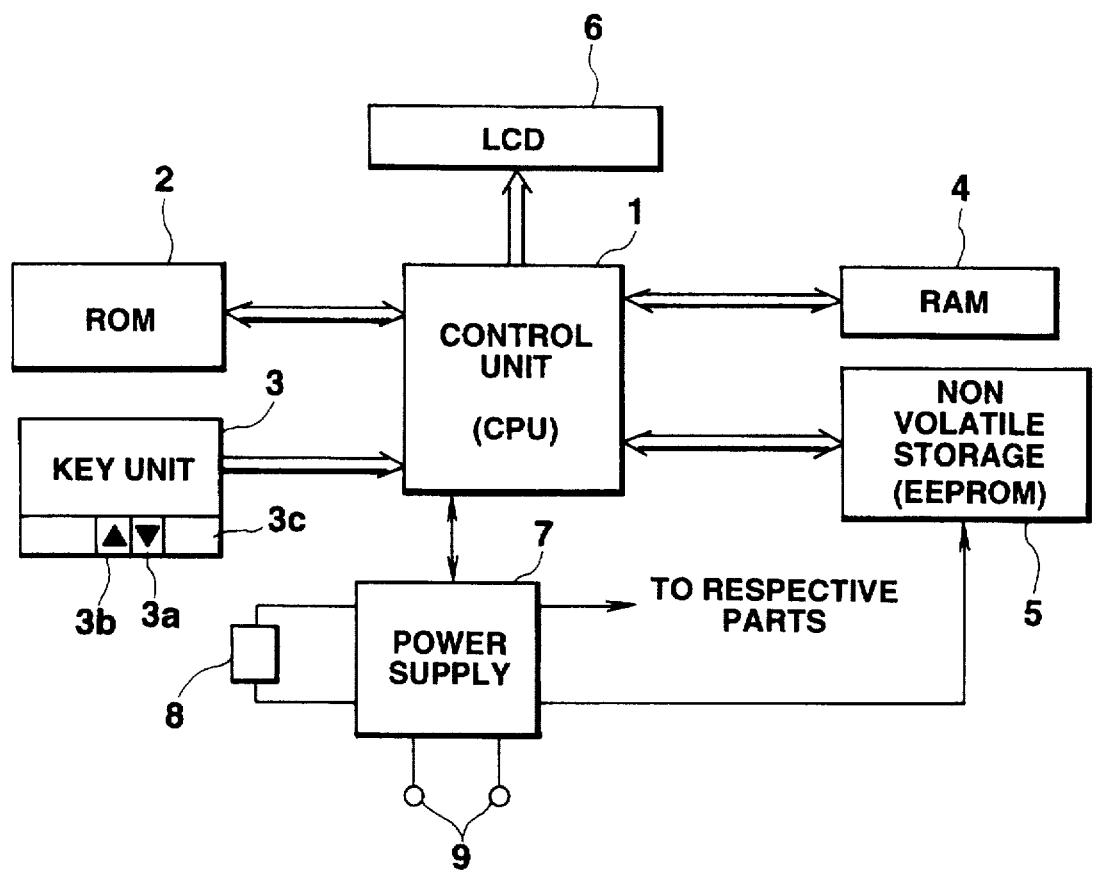

FIGS. 1 to 9 illustrate a first embodiment of the invention. FIG. 1 is a block diagram showing a hardware arrangement of the data storage system of the embodiment. According to control programs stored in a ROM 2, a control unit (CPU)

1 receives input directory data indicative of names, addresses, etc. from a key input unit 3 and loads it into RAM 4 for temporal storing. Afterwards, CPU 1 saves the data into a non-volatile memory in the form of EEPROM 5. To read out the data records from the EEPROM 5, a forward or reverse retrieval cursor key 3a or 3b in the key input unit 3 is operated. In response to such operation, CPU 2 reads stored data records in accordance with stored pointers (e.g., in an alphabetically forward or reverse sequence) and displays them on a liquid crystal display unit 6.

A power supply 7 stabilizes the output voltage of a battery 8 (e.g., solar type) and supplies it to various parts of the system. For writing data in the EEPROM 5, the power supply 7 stabilizes a comparatively high external voltage supplied from external input terminals 9 and supplies it to EEPROM 5. This is because the EEPROM 5 writing requires a higher voltage than the normal operation voltage.

The storage configuration of the EEPROM 5 will now be described with reference to FIG. 2. In this embodiment, addresses 1 to 100 are allotted to a system area 10 for storing system data to be described later. Addresses 101 to 400 are allotted to a data area 11 for storing data records. Addresses 401 to 512 are allotted to a spare area 12 for storing data records.

The data area 11 is made up of a plurality of (e.g., 300) of record storage areas $11A_1, 11A_2, \ldots, 11A_{300}$. Each record storage area 11A is designated by a single address. Each record storage area $11A_n$ has a field 11a for storing a backward pointer indicative of the address of the immediately preceding record storage area, a field 11b for storing directory data of name, address, etc., a field 11c for storing a forward pointer indicative of the address of the immediately succeeding record storage area and an error check field 11d for storing a specific error check code.

The data records stored in the data area 11 can be displayed in a pointer-dictated sequence (e.g., alphabetical order in this embodiment) by sequentially reading the backward or forward pointers 11a or 11c. Further, in this embodiment a specific code ("10" in this embodiment) is written in the error check field 11d. When reading out data, CPU 1 tests the code to determine whether the record storage area $11A_n$ is normal or not. This will be described later in more detail.

The system area 10 is made up of a plurality of (e.g., 100) of system data storage areas $10A_1$ to $10A_{100}$. Each system data storage area $10A_n$ has a field 10a for storing a top pointer to the top record area storing the first one of the sequenced data records, a field 10b for storing a bottom pointer to the bottom record area storing the last one of the sequenced data records, a field 10c for storing a current pointer to the record area of the currently displayed data record, a field 10d for storing a free area pointer to the top free address in the data area 11, and field 10e for storing an abnormality flag which is set upon occurrence of a failure of writing data in the data area 11. The spare data area 12 has the same configuration as the regular data area 11.

Figure 2:
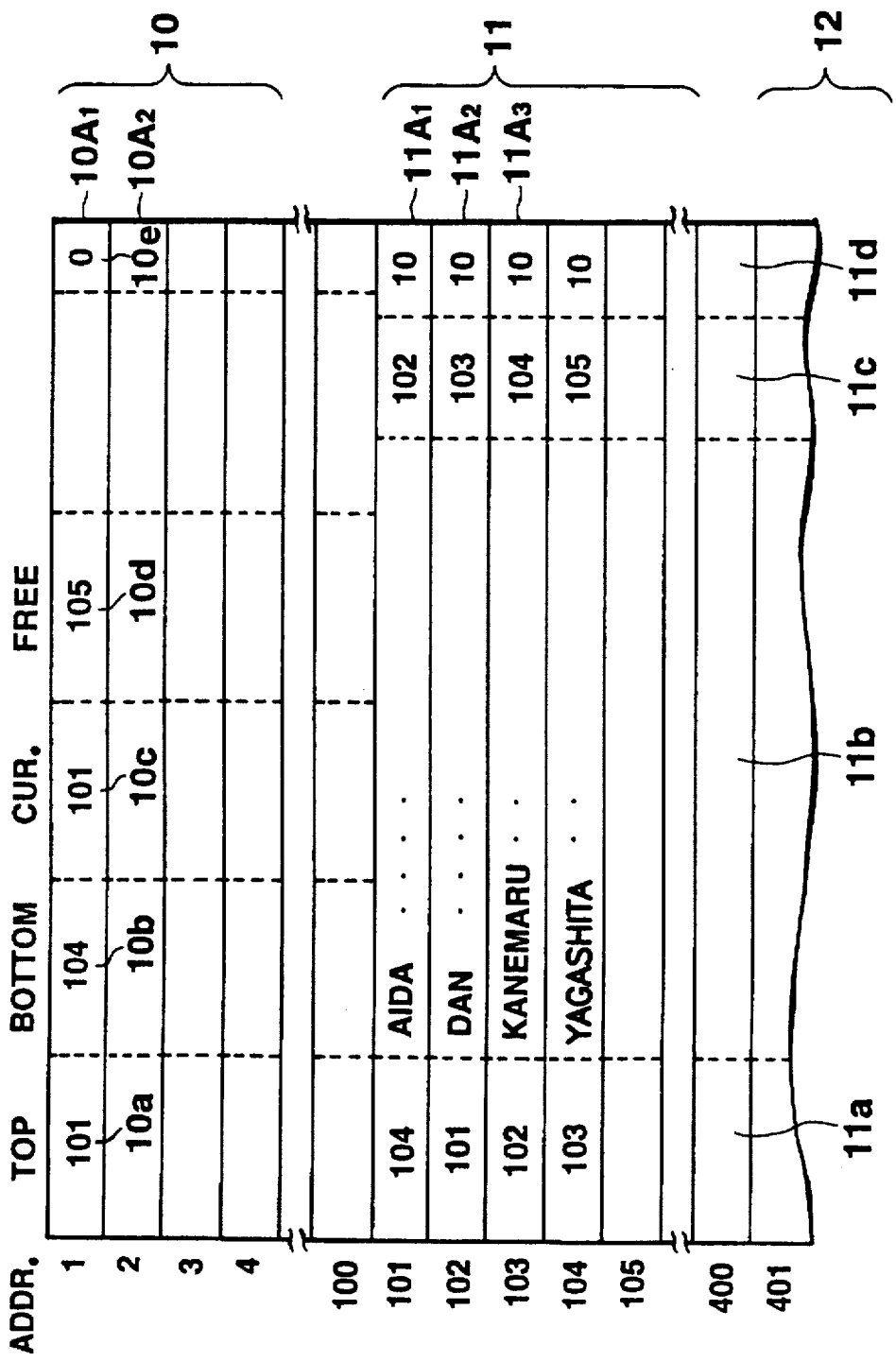

Suppose that four data records are stored in the data area 11 as shown in FIG. 2. The first data record "AIDA . . . " at address "101" has the backward pointer 11a of "104." This points to the record area storing the last data record "YAGISHITA . . . " The forward pointer "102" of the data record "AIDA . . . " points to the immediately succeeding record area with the data record "DAN . . . "

The backward pointer "101" of the second data record "DAN . . . " at address "102" indicates the address of the first data record "AIDA . . . " immediately preceding the data record "DAN . . . "

The system area 10 has the top pointer 10a of "101", which specifies the address of the top data record "AIDA . . . " in the alphabetically sequenced data records. The bottom pointer 10b of "104" indicates the address of the last or bottom data record "YAGISHITA . . . " The free area pointer 10d of "105" specifies the top address of a free area in the data area 11. The abnormal flag 10e normally has a value "0", and is set to "1" when an abnormality is detected in a data storage area $11A_i$.

The writing operation of the data storage system having the above construction will be described with reference to the flow chart of FIG. 3.

Figure 3:
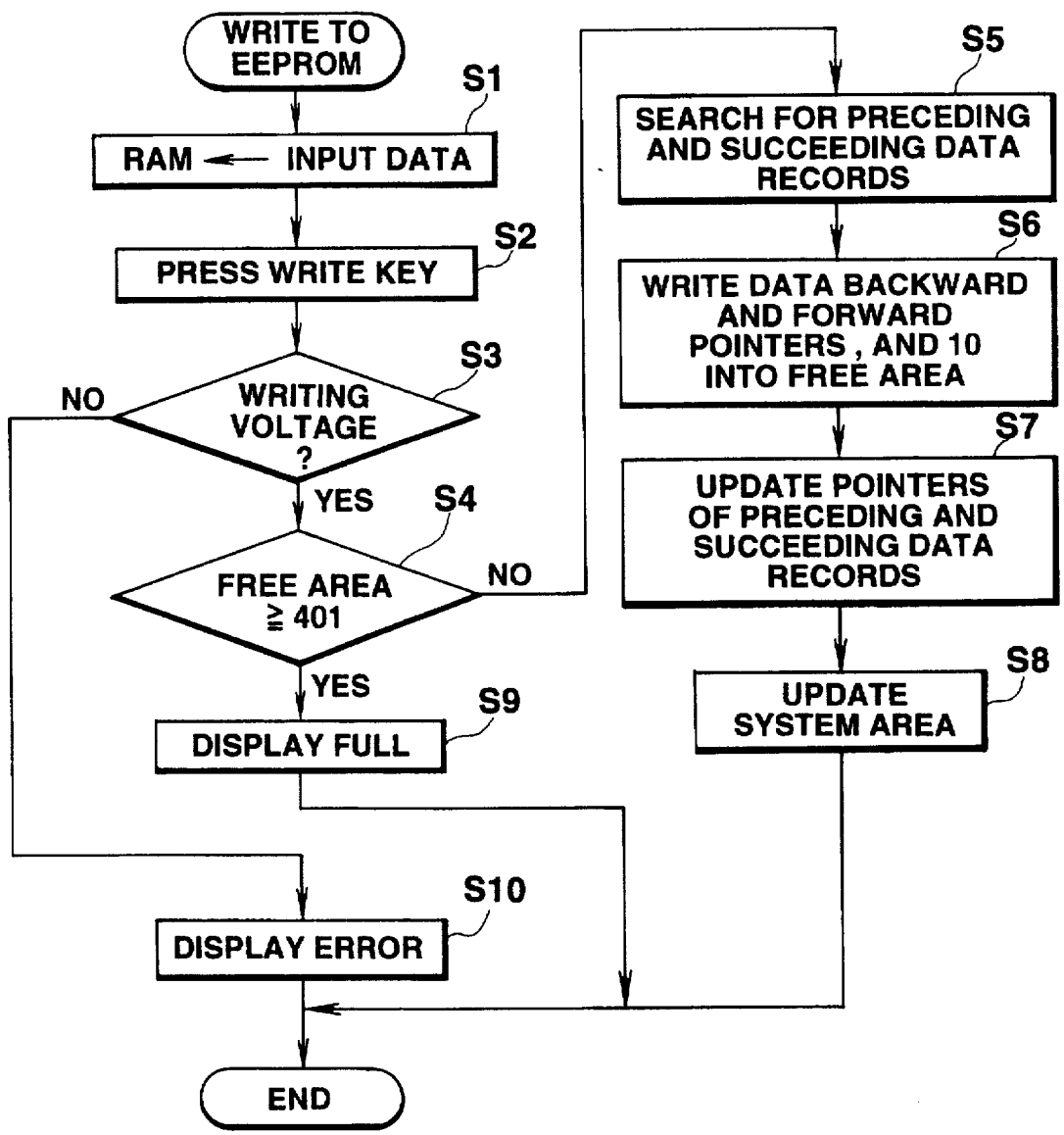
Figure 4:
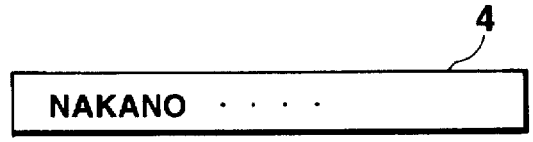

Referring to FIG. 3, step S1 loads input data from the key input unit 3 (new data record) to the RAM 4. Then, the write key 3c is operated and detected (step S2). The next step S3 checks if a writing voltage is supplied externally. Then, the affirmative step S4 is executed to see whether the free area pointer 10d is "401" or more. If this is the case, there is no free area in the data area 11, and step S9 visually indicates that the data area is full. If no writing voltage is found (S3), an error is displayed in step S10.

If the free area pointer is less than "401" (S4), there is a free area in the data area 11. Thus, step S5 is executed to search for the immediately preceding and succeeding data records, relative to the new data record to be added. To this end, step S5 compares the character string of the new data record with those of data records read out from the data area 11.

Then, step S6 writes, in EEPROM 5 at the address specified by the free area pointer, data of the new record from the RAM 4 together with the backward and forward pointers 11a and 11c. Further, check code "10" is written in the error check field 11d. Step S7 updates the forward pointer of the preceding data record and the backward pointer of the succeeding data record such that each pointer points to the new data record now written in EEPROM 5.

In this way, the new data record has been written in a free area. Thus, step S8 searches for the next free area and updates the free area pointer 10d to the free area found. The new data record can be the first or last one in the stored data record set. In such case, the top or bottom pointer is updated accordingly, using the address of the new data record.

Now, the data writing operation will be described more specifically in the case of writing data record "NAKANO . . . ", shown in FIG. 4, from RAM 4 to EEPROM 5 which stores four directory data records "AIDA . . . ", "DAN . . . ", etc. as shown in FIG. 2.

At first, step S5 searches for the data records alphabetically preceding and succeeding the data record "NAKANO . . . " As a result, the data records "KANEMARU . . . " and "YAGISHITA . . . " are found as preceding and succeeding ones, respectively. Thus, the next step S6 writes the data "NAKANO . . . " in the free area address "105" specified by the free area pointer 10d in the system area 10. Further, the backward pointer 11a of "NAKANO . . . " record at address "105" is set to the address "103" of the data record "KANEMARU . . . " immediately preceding the data record "NAKANO . . . " whereas the forward pointer 11c of "NAKANO . . . " record is set to the address "104" of the immediately succeeding data record "YAGISHITA . . . " The check code "10" is also written in the error check field 11d of the address "105."

Then, step S7 updates the forward pointer 11c of the preceding data record "KANEMARU . . . " and the backward pointer of the succeeding data record "YAGISHITA . . . ", each to the address "105" of the added data record "NAKANO . . . "

As a result, the directory data record "NAKANO . . . " is preserved in EEPROM 5 with a bidirectional link to the data records "KANEMARU . . . " and "YAGISHITA . . . " as shown in FIG. 5. Further, since at this time the address "105" is no longer any free area, step S8 updates the free area pointer 10d in the system area 10 to free area address "106."

Figure 6:
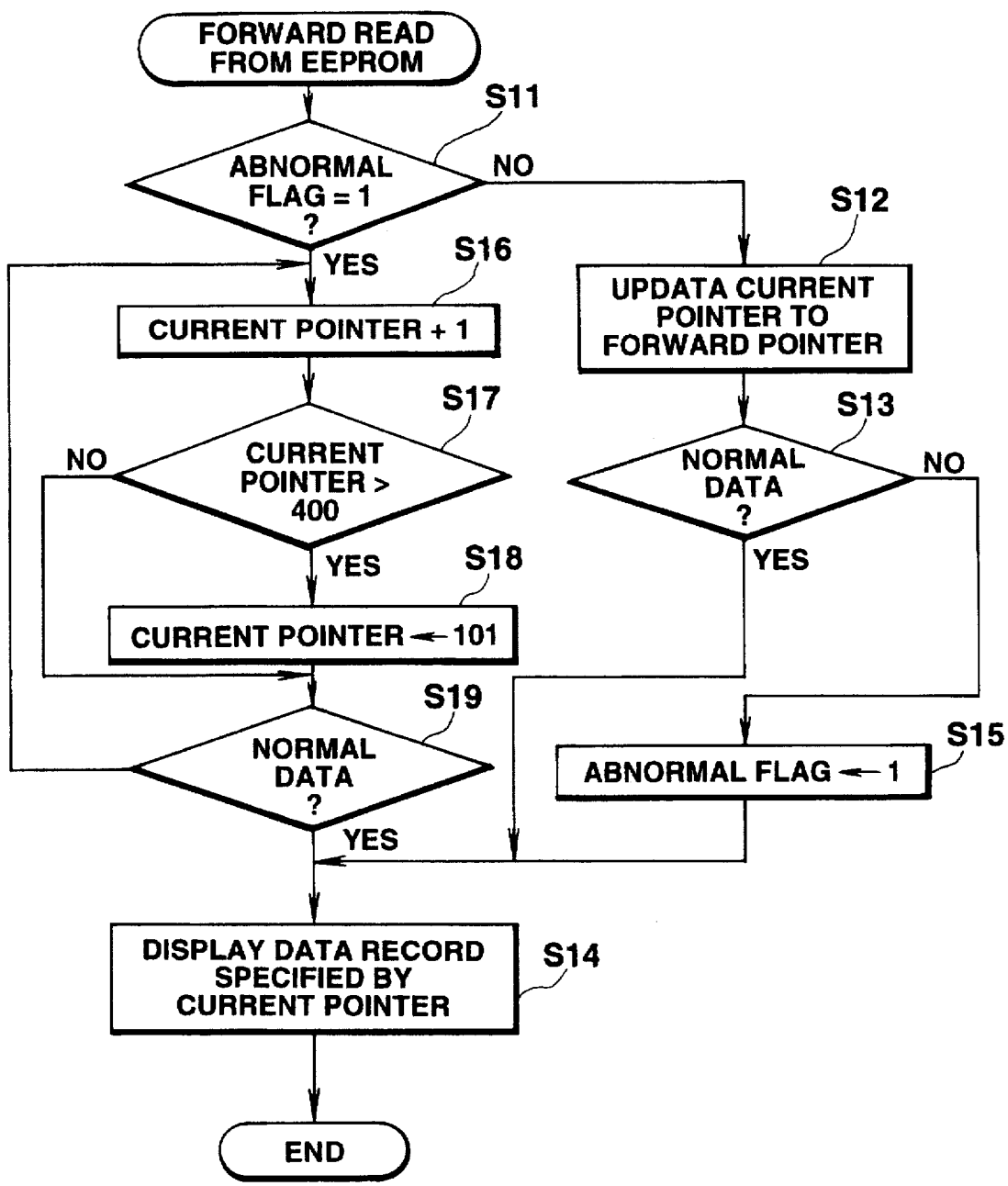

Now, the reading operation from the EEPROM 5 in response to the operation of the forward retrieval cursor key 3a will be described with reference to FIG. 6. At first, step S11 checks as to whether the abnormal flag 10e in the system area 10 has been set to "1".

If this is not the case, step S12 is executed to update the current pointer 10c to the forward pointer 11c of the current data record, thus specifying the next data record to be read out. Step S13 checks as to whether correct error check code "10" has been stored in the error check field 11d of the next data record, now specified by the updated current pointer 10c.

If the correct code "10" has been read out from the error check field 11d, this means that the pertinent data record area 11A$_i$ is normal. Thus, step S14 is executed-to read out the name-and-address data of that data record specified by the current pointer 10c and display it on the liquid crystal display 6.

If the step S13 has read an erroneous code having a numeral other than "10" from the error check field 11d, this means that the pertinent data record area 11A$_i$ is defective. Thus, step S15 is executed to set the abnormal flag 10e to "1". Then, the routine goes to the step S14 to read out the name-and-address data in the record area designated by the current pointer 10c display on the liquid crystal display 6.

Once the abnormal flag 10e has been set to "1", this is confirmed by step S11 in response to the next operation of the forward retrieval cursor key 3a. The routine thus goes to step S16 to increment the current pointer 10c by one. The next step S17 checks as to whether the current pointer 10c has exceeded "400". If this is the case, step S18 is executed to return the current pointer 10c to the data area 11 starting address "101."

After the step S17 finding the current pointer 10c of "400" or less, or after the step 18 returning the current pointer 10c, step S19 is executed to check as to whether the data in the current data record area is normal. This is done by testing the error check code field 11d to see whether it has a correct value of "10" or not. If the data is not normal, the routine goes back to step S16 to increment the current pointer 10c to get access to the data record placed at the next address.

If the data is normal, the routine goes to step S14 to display the data in the record area specified by the current pointer 10c on the liquid crystal display 6.

Specifically, with the abnormal flag 10e set to "1", each operation of the forward retrieval cursor key 3a causes the steps S11, S16 to S19 and S14 to be executed. In this way, the data records stored in the data area 11 are displayed in their address-increasing order.

Figure 8:
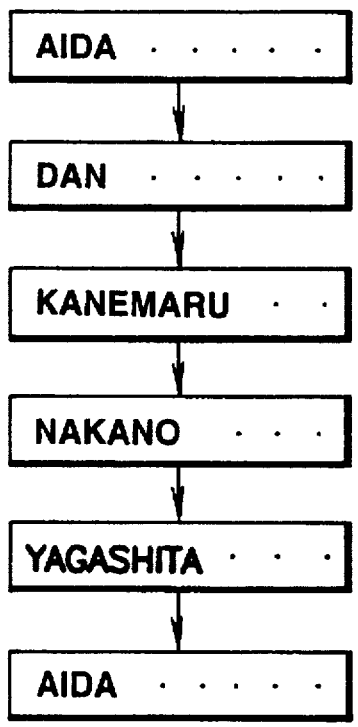
Figure 9:
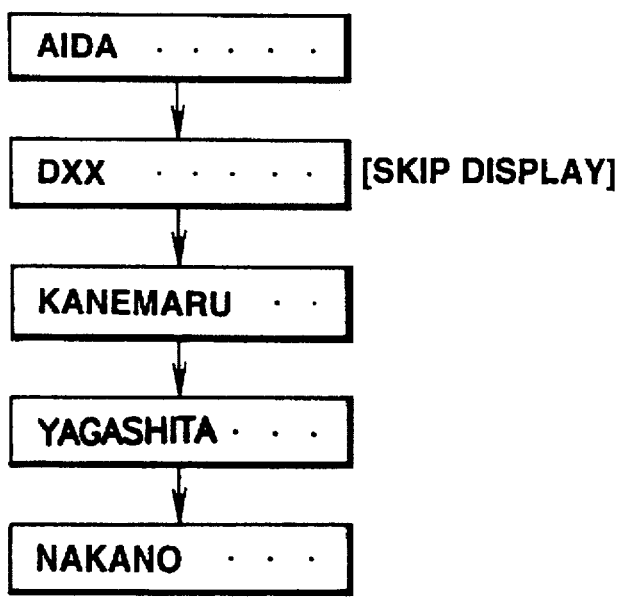

Now, examples of display will be described with reference to FIGS. 8 and 9, in which EEPROM 5 has five directory data records. In the first example, the data record areas 11A are all normal as shown in FIG. 5. In the second example there is an abnormal data record area as shown in FIG. 7.

When all data record areas 11A are normal, successive operations of the forward retrieval cursor key 3a cause the stored data records to be retrieved in the forward alphabet order by following forward pointers, one after another. Thus, the data records are displayed in the order of "AIDA . . . ", "DAN . . . ", "KANEMARU . . . ", etc, as shown in FIG. 8. By successively operating the reverse retrieval cursor key 3b instead of the key 3a, the data records are displayed in the reverse alphabet order by following backward pointers, one after another.

If there is abnormality in the data storage area with the data record "DAN . . . ", for instance, the data storage system reads an erroneous check code (having a value other than "10") from the record "DAN . . . ", thus setting the abnormal flag 10e to "1".

FIG. 7 shows the contents of EEPROM 5 in which the abnormal flag 10e is set to "1" due to abnormality of the data record area 11A with the data record "DAN . . . "

In this case, the abnormal flag 10e has been set. Thus, successive operations of the forward retrieval cursor key 3a cause the data records to be retrieved and displayed in an address increasing order. Specifically, the first operation of the forward retrieval cursor key 3a results in displaying the data record "AIDA . . . " of the top address "101". The data record "DAN . . . " of the next address "102" is accessed in response to the second operation of key 3a. However, since this data record is defective, it is not displayed but is skipped. Successive operations of the reverse retrieval cursor key 3b instead of the key 3a result in displaying the data records in an address decreasing order.

In this manner, a failure of writing in a data storage area 11A in the EEPROM 5 causes setting the abnormal flag 10e. Then data records in the EEPROM 5 are displayed in a predetermined order, here, in an address order without referencing backward or forward pointers. Thus, the present data storage system can display the data records from the EEPROM 5 even in the event of data link disconnection caused by a pointer error.

Second Embodiment

FIGS. 10 to 14 illustrate a second embodiment of the invention. In this embodiment, the hardware arrangement is the same as that of the first embodiment shown in FIG. 1. Parts like those in the first embodiment are designated by like reference numerals and symbols and are not described in detail.

Figure 10:
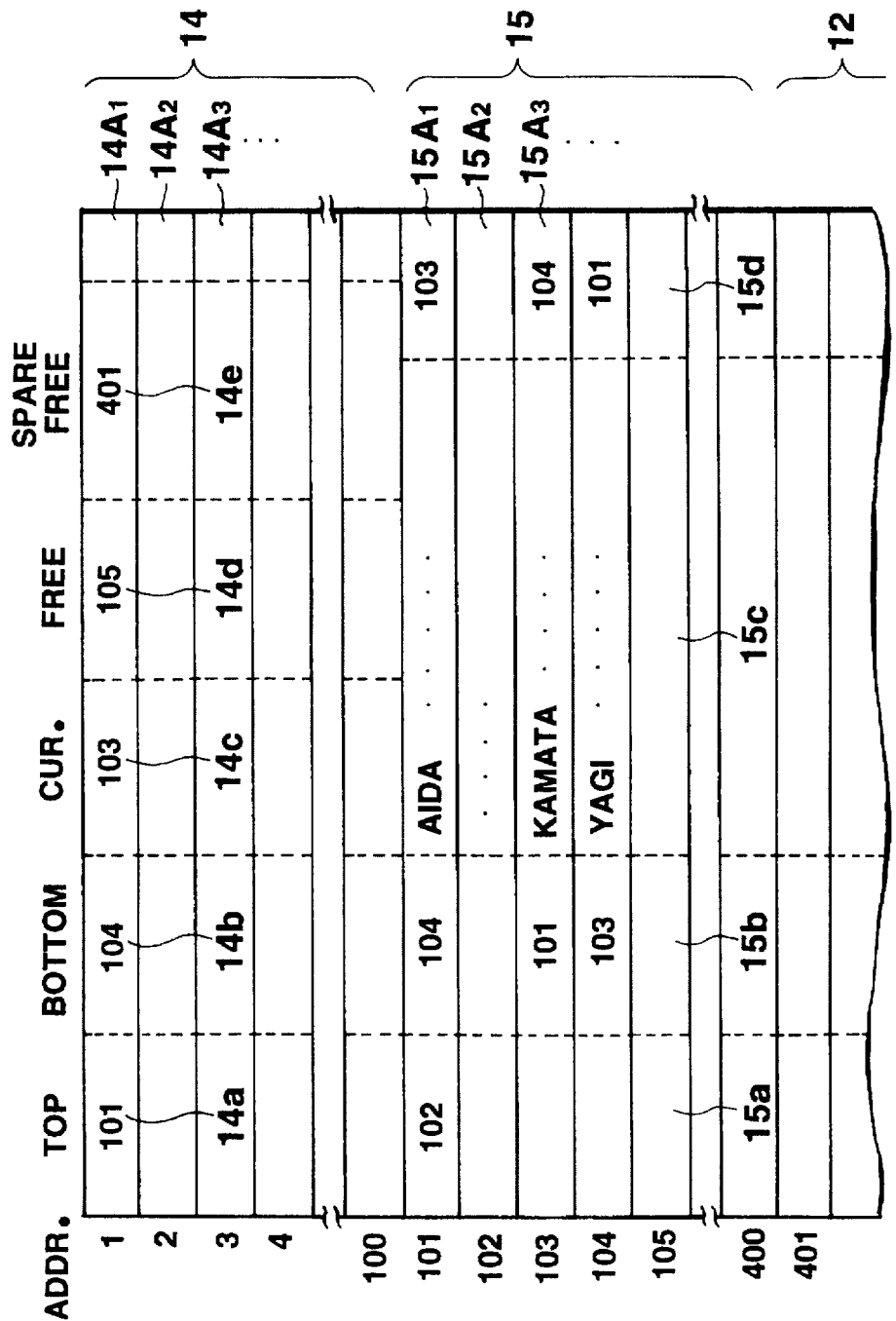

FIG. 10 shows a map of the EEPROM 5 in accordance with the second embodiment. In this embodiment, addresses "1" to "100" are allotted to a system area 14 to be described later, addresses "101" to "400" are allotted to a data area 15, and addresses "401" to "512" are allotted to a spare data area 12.

The data area 15 comprises a plurality of (here, 300) data record areas 15A$_1$, 15A$_2$, . . . , 15A$_{300}$. In this embodiment, a directory data record with data amount exceeding the storage capacity of a single storage area is recorded over a plurality of storage areas.

Each data record area 15A has a field 15a for storing a continuation pointer to a data record area where a continuation part of a data record is stored if the data record is occupied by a plurality of data record areas, a field 15b for storing a backward pointer to an alphabetically preceding data record, a field 15c for storing directory or name-and-address data, and a field 15d for storing a forward pointer to an alphabetically succeeding data record. The space data area 12 also comprises a plurality of data record areas and has the same configuration as the data area 15.

The system area 14 stores system data for managing the data area 15. The system area 14 comprises a plurality of system data storage areas 14A₁, 14A₂, ..., 14A₁₀₀. Each system data storage area 14A has a field 14a for storing a top pointer specifying the top one of the sequenced data records in the data area 15, a field 14b for storing a bottom pointer indicative of the bottom one of the data records, a field 14c for storing a current pointer specifying a data record currently in display, a field 14d for storing a free area pointer indicative of a free area starting address in the data area 11, and a field 14e for storing a free area pointer indicative of a free area starting address in the data area 11, and a field 14e for storing a free spare area pointer indicative of a free area starting address in the spare data area 12.

In accordance with the second embodiment, each time when system data is updated, the data storage system writes it in a different one of the system data areas by selecting first the area 14A1, then 14A2, then 14A3 and so on, thus avoiding repeated writing operations in the same area.

FIG. 10 shows three data records "AIDA . . . ", "KAMATA . . . " and "YAGI . . . " stored in the data area 15 in an alphabetical order. The data record "AIDA . . . " is recorded over the addresses "101" and "102" because of its large data quantity.

The address "101" stores a first part of the top data record "AIDA . . . " in the alphabet sequence. The continuation pointer 15a at address "101" specifies the continuation address "102" of the continuation part of this data record. The backward pointer 15b of "104" specifies the alphabetically preceding data record, here, the bottom or last data record "YAGISHITA . . . " The forward pointer 15d points to the address "103" of the succeeding data record "KAMATA . . . "

The address "103" stores the second data record "KAMATA . . . " in the alphabet sequence. Since this data record occupied a single data storage area 11A, its continuation pointer 15 has a null value. The backward pointer 15b has the value of "101" specifying the preceding data record "AIDA . . . " The forward pointer 15c has the value of "104" pointing to the succeeding data record "YAGI . . . "

In the system area 14, the top pointer 14a indicates the address "101" of the top or first data record "AIDA . . . " The bottom pointer 14b indicates the address "104" of the bottom or last data record "YAGISHITA . . . " The current pointer 14c indicates the address "103" of the data record "KAMATA . . . " The free area pointer 14d points to the starting address "105" of the free area in the data area 15. The free spare area pointer 14e points to the top address "401" of the spare data area 12.

The EEPROM writing operation of the data storage system of the second embodiment will now be described with reference to the flow chart of FIG. 11.

Figure 11:
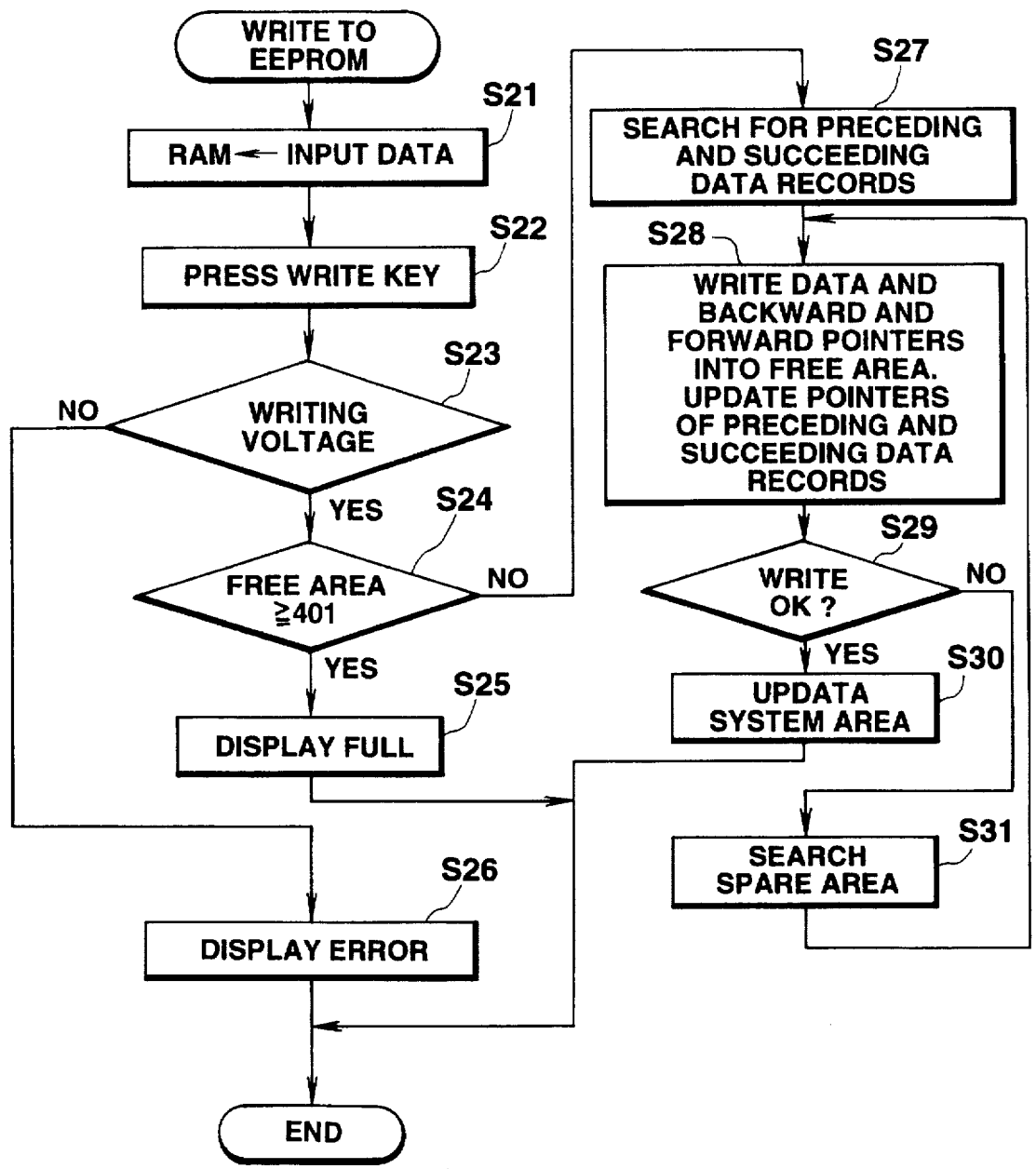

Referring to FIG. 11, step S21 loads input data from the key input unit 3 into RAM 4. Then, the write key 3c is operated. This is detected at step S22. The next step S23 checks as to whether an external write voltage is supplied to the external input terminals 9. If this is the case, the step S24 is executed to check as to whether the free area pointer 14d is at least "401". If so, all data record storage areas of the data area 15 are occupied by data records. Thus, the routine goes to step S25 to indicate the full state of EEPROM 5 on the liquid crystal display 6. If no external write voltage supply is found at step S23, step S26 is executed to display the error.

If the free area pointer 14d is found to be "400" or less (step S24), that is, if there is a free area in the data area 15, step S27 is executed to search for the data records alphabetically preceding and succeeding a data record to be written. To this end, step S27 compares the character string of the data record to be written with those of data records read out from the data area 15.

The next step S28 writes the name-and-address data from RAM into the field 15c of the address indicated by the free area pointer 14d, and writes the addresses of the preceding and succeeding data records into the backward and forward pointer fields 15a and 15c, respectively. Once writing the data record, step 28 tests the writing by comparing the data before and after the writing. If mismatched, step 28 executes the second writing and repeats the writing test.

If step S29 finds successful writing, step S30 is executed to update the system data in the system area 14.

The system data updating step S30 will now be described with reference to FIGS. 10 and 12.

First, the description takes up writing an input data record "NAKANO . . . " into EEPROM 5 with data records shown in FIG. 10.

Since the free area pointer 14d points to address "105", the data record "NAKANO . . . " is written in the address "105". The data writing in the address "105" causes changing the top address of the free area in the data area 15 from "105" to "106", requiring updating the system data in terms of the free area pointer. At the previous updating, the system data was written at the address "1" in the system area 14 as shown in FIG. 10. At this time, updated system data is written at the next address "2".

Specifically, the free area address "106" is written in the free area pointer field 14d of the address "2" in the system area 14. The current pointer is updated to "105" and written in the field 14c of address "2." The other pointers are not changed and thus copied into corresponding fields of address "102."

Figure 12:
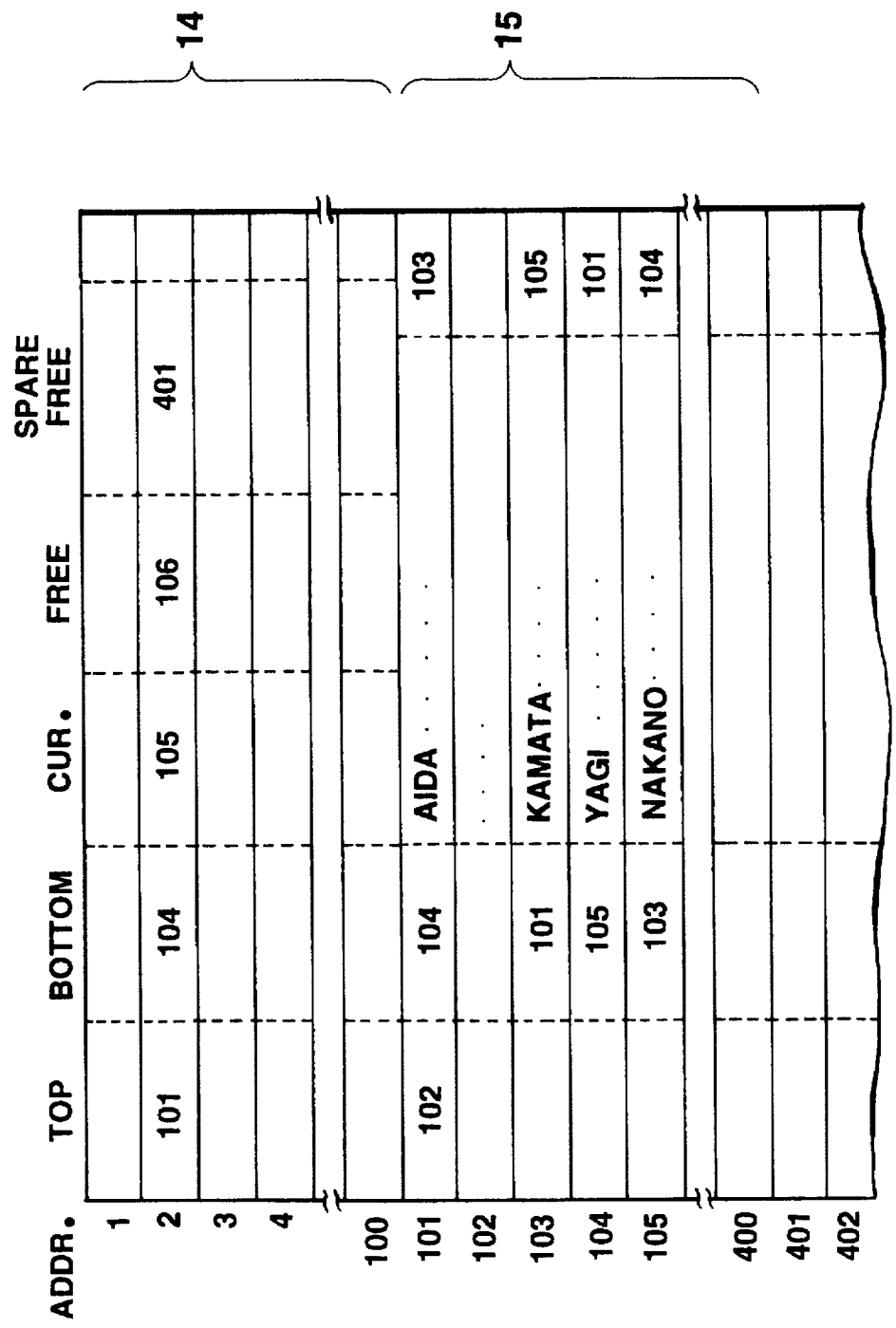

Now, the description takes up correcting or updating a data record in the EEPROM 5 with reference to FIGS. 12 to 14.

In FIG. 12 four directory data records "AIDA . . . ", "KAMATA . . . ", "YAGI . . . " and "NAKANO . . . " have been stored in the data area 15 of EEPROM 5. The top pointer 14a in the system area 14 points to the address "101" of the top data record in the data area. The bottom pointer 14b points to the address "104" of the bottom data record. The current pointer 14c points to the address "103." The free area pointer 14d points to the top address "106" of the free area in the data area 11. The free spare area pointer 14e specifies the top address "401" of the free area in the spare data area 12.

It is now desired to write an input data record "OGAWA . . . " while the data record "KAMATA . . . " (to be deleted) at address "103" is in display. To this end, the data storage system writes the data record "OGAWA . . . " in the free area address "106" specified by the free area pointer 14d. At the same time, it searches through the data area 15 (except for "KAMATA . . . ") for the data records alphabetically preceding and succeeding the data record "OGAWA . . . ", and sets the backward and forward pointers 15b and 15d to their addresses. Further, it updates the forward pointer of the preceding data record and the backward pointer of the succeeding data record each equal to the address "106" (see FIG. 13). The data storage system deletes the data record "KAMATA . . . " at address "103."

As a result of this data updating, the top address of the free area is changed. Thus, the system data updating is effected. Since the previous system data has been written at address "2" in the system area 14, the system data updated this time is written in the next address "3".

As a result, system pointers are written in the address "3" of the system area 14 as shown in FIG. 14. Since the area of the address "103" is made free, the free area pointer 14d is updated to "103". The current pointer 14c is updated to the address "106" of the added data record "OGAWA . . . ".

Referring back to FIG. 11, if step S29 has failed twice in writing data in a record area 15A, the area is considered defective. Then the routine goes to step S31 to select the spare free area pointer 14e as the data write address. The routine then goes back to step S28 to write the input data record (i.e., name-and-address data, backward and forward pointers) in the address indicated by the free spare area pointer 14e. In addition, the backward pointer 15b of the succeeding data record and the forward pointer 15d of the preceding data record are updated to the spare data area address. Then, the step S29 and following steps are executed.

In this manner, the data storage system of the second embodiment effects the system data updating by changing a system data storage area in which updated system data is written, thus preventing repeated writing in the same storage area.

The above configurations of the system and data areas 14 and 15 for storing system data and directory data are by no means limitative, and can be modified.

Further, while in the above embodiment data records in EEPROM are sequenced, system data updating feature of the invention is also applicable to unsequenced data records.

Third Embodiment

Figure 15:
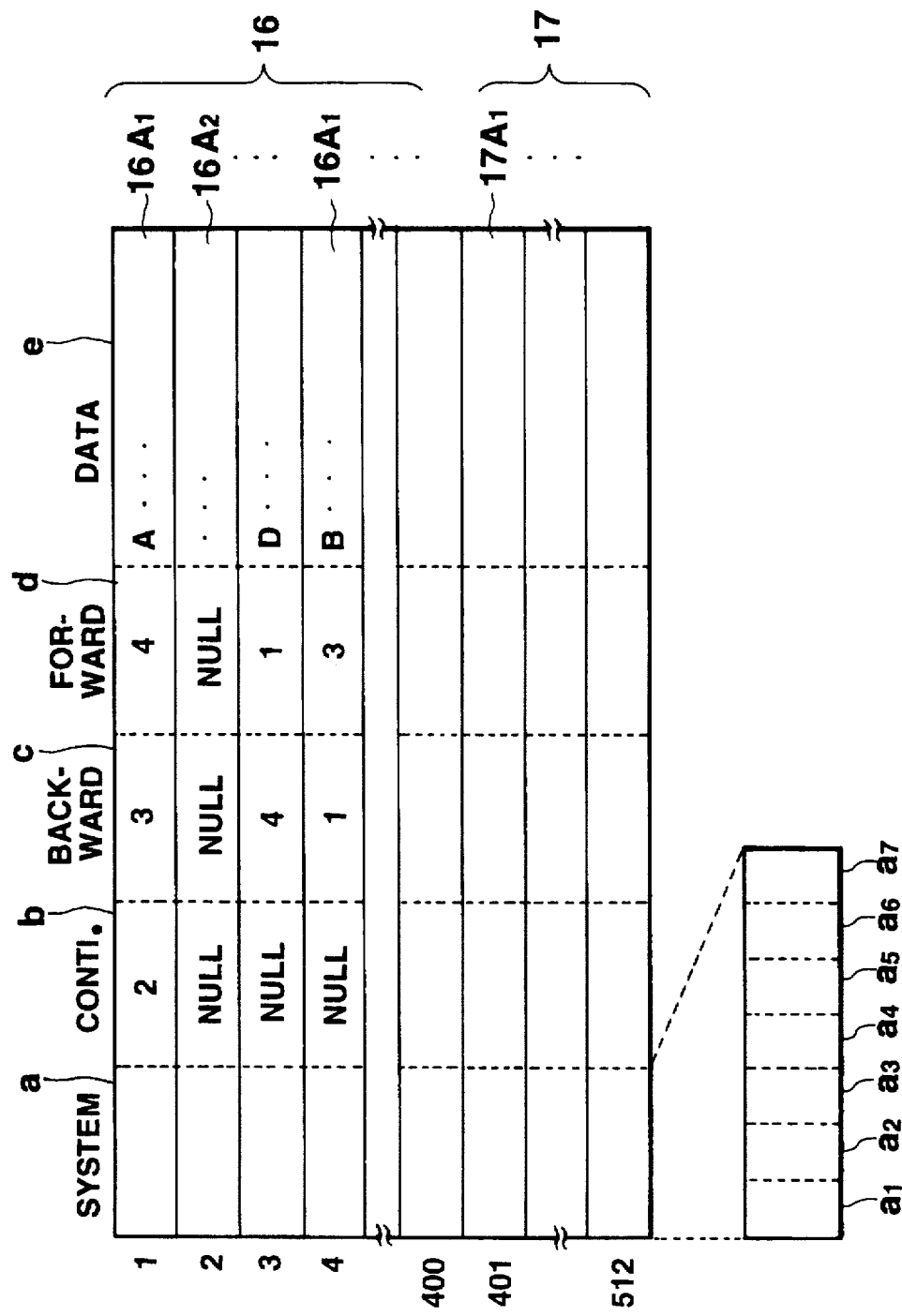
Figure 16:
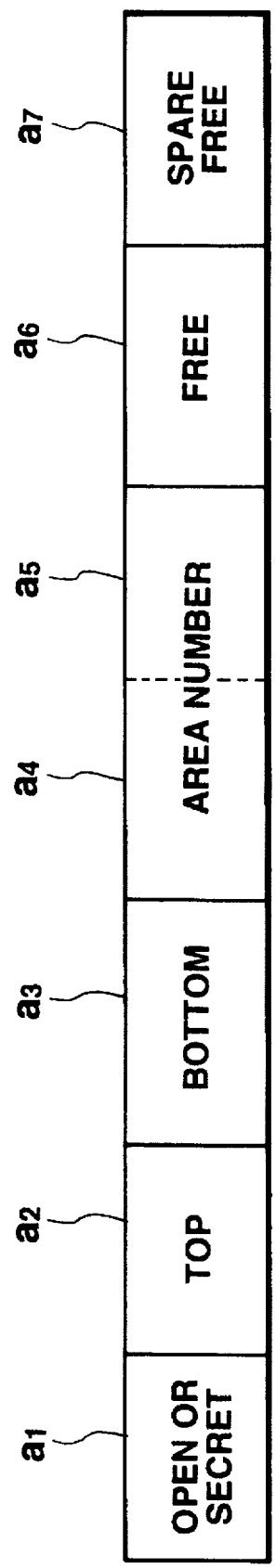
Figure 17:
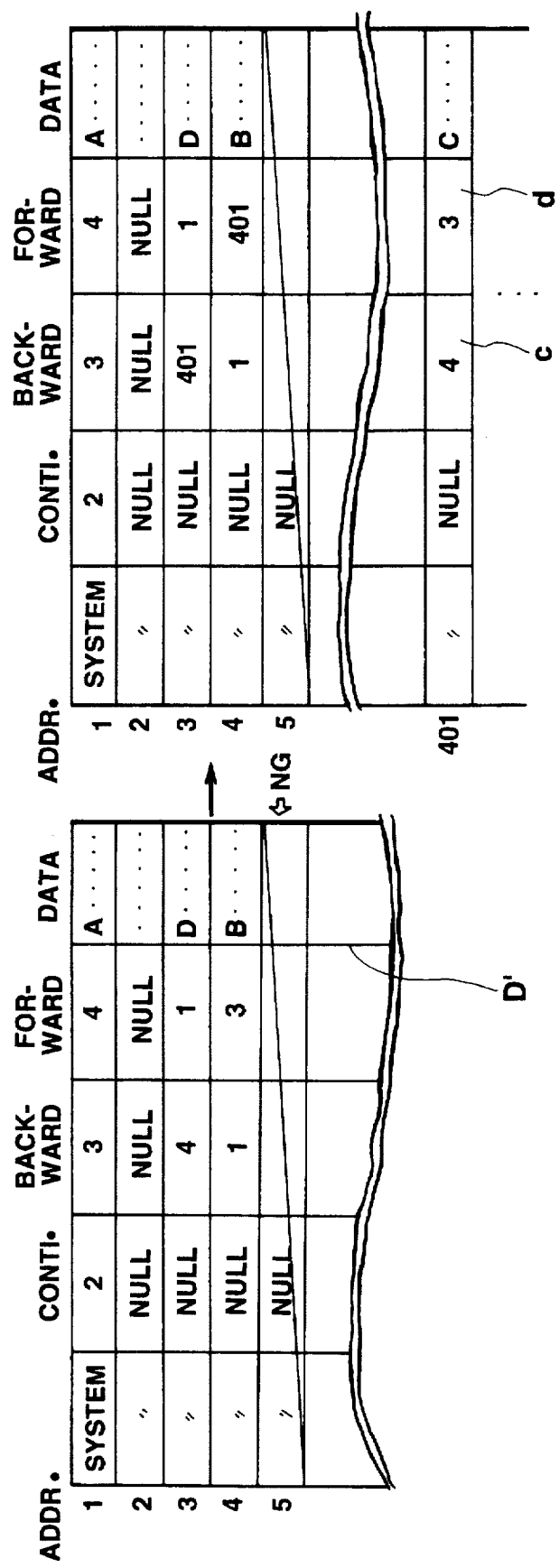

FIGS. 15 to 17 illustrate a third embodiment of the invention. In this embodiment, the hardware arrangement is the same as that of the first embodiment shown in FIG. 1, and the flow chart of the operation routine is the same as that of the second embodiment shown in FIG. 11. The third embodiment employs, however, a different data arrangement of EEPROM 5. The data records are classified into open and secret ones. Access to secret data records are prohibited without a pass code.

FIG. 15 shows the storage configuration of EEPROM 5 in accordance with the third embodiment. In EEPROM 5, addresses "1" to "400" are allotted to a data area 16, and addresses "401" to "512" are allotted to a spare data area 17.

The data area 16 comprises a plurality of (for instance 400) data storage areas $16A_1$, $16A_2$, . . . $16A_i$. A data record beyond the storage capacity of a single data storage area 16A, is recorded over a plurality of data storage areas 16A.

Each data storage area 11A has a system field a (management field) for storing system data (management data), a field b for storing a continuation pointer indicative of the address of a continuation part of a data record (if any), a field c for storing a backward pointer indicative of the address of the alphabetically preceding data record, a field d for storing a forward pointer indicative of the address of the succeeding data record, and a field e for storing directory (name-and-address) data. The spare data area 17 also comprises a plurality of (for instance 112) spare data storage areas $17A_1$, $17A_2$, . . . $17A_i$ and has the same configuration as the data area 16.

FIG. 16 shows the format of a system field a.

The system field a is represented by seven bits. The first bit $a_1$ indicates whether the data record is open or secret. The bit $a_1$ of "1" indicates a secret data record. For an open data record, the bit $a_1$ is set to "0."

The second bit $a_2$ indicates whether the data record is the top record in the alphabetically sequenced data record set stored in the area 16 and 17. The bit $a_2$ of the top record is set to "1." For other records, bit a is set to "0."

The third bit $a_3$ indicates whether the data record is the last record in the alphabetically sequenced record set, and is set to "1" for the last record, otherwise set to "0."

The fourth and fifth bits $a_4$ and $a_5$ indicate a number of areas occupied by the data record. The bits $a_4$ and $a_5$ are set to "01" for a single-area data record, "10" for a two-area data record, and "11" for a three-area record.

The sixth bit $a_6$ indicates whether the data storage area 16A is the first free area. The bit $a_6$ is set to "1" for the first free area, otherwise set to "0."

The seventh bit $a_7$ indicates whether the spare storage area 17A is the top free spare area. The bit $a_7$ is set to "1" for the top free spare area, otherwise set to "0."

In FIG. 15, the data area 16 stores three data records of "A . . .", "B . . .", and "D . . ." at fields e. The data record "A . . ." has a large data quantity and is recorded over addresses "1" and "2."

The continuation pointer b of the record "A . . ." at address "1" points to address "2" of a continuation part of the record. The backward pointer c points to address "3" of, here, the last data record "D . . ." The forward pointer d points to address "4" of the alphabetically succeeding data record "B . . ."

The bit $a_1$ in the system field a of address "1" is set to "0" if the record "A . . ." is open. If the record "A . . ." is secret, it is set to "1." The bit $a_2$ is set to "1" since the data record "A . . ." is the top one in the data record set in terms of alphabetical order. The bit $a_3$ is set to "0." The bits $a_4$ and $a_5$ are set to "10" because the data record "A . . ." occupies the two addresses "1" and "2". Since these areas are occupied by data, bits $a_6$ and $a_7$ are each set to "0".

The continuation pointer b of the second data record "B . . ." at address "4", has a null value since this data record is not divided. The backward pointer c points to the address "1" of the preceding data record "A . . ." The forward pointer d points to the address "3" of the succeeding data record "D . . ."

Now, the data writing operation of the data storage system having the above arrangement will be described with reference to the flow chart of FIG. 11.

Referring to FIG. 11, step S21 loads RAM 4 with input data from the key input unit 3. Then the write key is operated and detected (step S22). This causes step S23 to test the external write voltage supply. If the external write voltage is supplied, the routine goes to step S24 to search for a top free area. This is done by looking for an area having bit $a_6$ of "1" in its system field a.

If no such area is found, that is, if there is no free area in the data area 16, the routine goes to step S25 to display, on the liquid crystal display 6, full state of EEPROM 5. If no external write voltage is supplied (step S23), the error is displayed in step S26.

If a free area is found in the data area 16 (step 24), step S27 is executed to search for the data records alphabetically preceding and succeeding the data record to be written this time. To this end, step S27 compares the character string of the name-and-address data to be written with those of the name-and-address data records read out from EEPROM 5.

The next step S28 writes the name-and-address data from RAM 4 into EEPROM 5 at the free area address with system bit $a_6$ of "1." Further step S28 writes backward and forward pointers c and d using the addresses of the preceding and succeeding data records. In addition, step S28 updates the forward pointer of the preceding data record and the backward pointer of the succeeding data record, each equal to the address in which the new data record is written this time.

Then step 29 tests the writing by comparing the data before the writing with those after the writing. If the first writing has failed, step 29 executes the second writing, and tests it.

If successful writing is found, the routine goes to step S30 to update system fields. Specifically, bit $a_0$ of the system field a at the new data record address is set to "0" indicative of "data occupied." Sequential search is performed for a free area. If found, the bit $a_6$ of the system field at the free area address is set to "1" indicative of a top free area. The new data record can be the top or bottom data record. If this is the case, bit $a_2$ (top) or $a_3$ (bottom) of the new data record is set to "1."

If step S29 has failed twice in data writing, that data storage area 16A is considered defective. Thus, the routine goes to step S31 to search for a top free spare area. This is done by successively retrieving the system fields a in the spare data storage areas 17A to find out an area with bit $a_7$ of "1." If the top free spare area is found, the new record (i.e., input name-and-address data, backward and forward pointers, and system data) is written in that spare data storage area 17A. Further, the backward pointer c of the succeeding data record and the forward pointer d of the preceding data record are updated to the address of the new data record storage area 17A.

In this manner, write failure of a data storage area 16A in the data area 16 is compensated for by writing in a spare data storage area 17. Thus, it is always possible to record data records up to the storage capacity of the data area 16 (i.e., 400 data records in this embodiment). Since the spare data area 17 is used only when write failure in a data storage area 16A has occurred, there will be no or rare write failure in the spare data area 17, thus assuring reliable writing.

The description now takes up a case in which writing data record "C . . . " in address "5" was attempted twice but failed.

At first, the data storage system searches for a top free spare area by sequentially reading system fields of the spare data storage area 17. The top free spare area is located at address "401." Then, the data storage system writes the input data record "C . . . " in address "401." It searches for data records preceding and succeeding the record "C . . . " The preceding data record is "B . . . " at address "4" whereas the succeeding data record is "D . . . " at address "3." Thus, the backward pointer c of the record "C . . . " is set to the preceding record address "4", and the forward pointer d is set to the succeeding record address "3."

Further, the forward pointer d of the preceding record "B . . . " and the backward pointer c of the succeeding record "D . . . " are each set to the "C . . . " record address "401."

To summarize, in accordance with the third embodiment, each data storage area 16A, 17A in data and spare areas 16, 17 is provided with a system field a for storing system or management data. The system data indicates on a bit-by-bit basis whether the data record is the top data record, whether it is the bottom data record, whether it is the top free area, whether it is the top free spare area, and so on. This storage allocation takes advantage over a storage allocation using separate areas for system and data in terms of minimizing the required storage capacity.

In the third embodiment, the system field a is configured by seven bits, but can be modified. The data records in EEPROM 5 are sequenced. The invention, however, can apply to unsequenced data records.

In the embodiments, EEPROM is employed for storing data records. However, other memories, e.g., a RAM, a ferroelectric RAM (FRAM), an EROM, a magnetic disk, etc. could be used. The present data storage system can apply to small size electronic caculators, electronic diaries, word processors, personal computers, etc.

What is claimed is:

1. A data storage system, comprising:

data storage means having a plurality of storage areas each for storing data together with backward and forward pointers pointing to storage areas storing immediately preceding and succeeding data, respectively;

writing means for writing data together with an error check code in each of said plurality of storage areas;

testing means for testing each said error check code to determine whether said storage areas are normal or abnormal;

reading means responsive to said testing means for reading data from said plurality of storage areas by following one of said backward and forward pointers when said testing means determines that said storage areas are normal, and for reading data from said plurality of storage areas in a predetermined order when said testing means determines that said storage areas are abnormal; and display means for displaying data read out by said reading means.

2. The data storage system according to claim 1, wherein:

said data storage means comprises a read-and-write non-volatile memory.

3. The data storage system according to claim 1, further comprising:

data input means for inputting data; and storage control means for storing data inputted from said data input means in said data storage means.

4. A data storage system, comprising:

data input means for inputting data;

data storage means having a plurality of storage areas for storing data inputted from said data input means, each of said plurality of storage areas being represented by a storage address data;

storage control means for searching through said data storage means to find an empty storage area with no data stored therein, and for storing, in the empty storage area, data inputted from said data input means together with two storage address data, the two storage address data respectively representing a storage area having stored therein data alphabetically preceding the data stored in the empty storage area and a storage area having stored therein data alphabetically succeeding the data stored in the empty storage area;

an externally operable key;

testing means responsive to said externally operable key for testing a storage area of said data storage means to determine whether the data stored therein contains an error;

first read control means responsive to said testing means for successively reading data from said plurality of storage areas in alphabetical order in accordance with said storage address data when said testing means determines that the data stored in a storage area does not contain an error; and second read control means responsive to said testing means for successively reading data from said plurality of storage areas in a predetermined order when said testing means determines that the data stored in a storage area contains an error.

5. The data storage system according to claim 4, wherein:

said data storage means comprises a read-and-write nonvolatile memory.

6. The data storage system according to claim 4, further comprising:

display means for visually displaying data read out by said first and second read control means.

7. The storage system according to claim 4, further comprising:

a plurality of system data storage means for storing system data specifying an address of a storage area of said data storage means;

data writing means for writing data in said system data storage means;

system writing means responsive to said data writing means for writing updated system data in one of said plurality of system data storage means which is different from the system data storage means storing previous system data.

8. The data storage system according to claim 7, wherein:

said data storage means comprises a read-and-write nonvolatile memory.

9. The data storage system according to claim 7, further comprising:

display means for visually displaying data stored in said data storage means.

10. The data storage system according to claim 4, wherein:

said plurality of storage areas of said data storage means each have a management field for storing management information which indicates leading data among data stored in said storage area, and a leading portion of a free area in said storage area.

11. The data storage system according to claim 10, wherein:

said data storage means comprises a read-and write nonvolatile memory.

12. The data storage system according to claim 10, further comprising:

display means for visually displaying data stored in the data storage areas.

13. The data storage system according to claim 1, wherein said reading means, which reads data in a predetermined order, comprises means for reading data from said plurality of storage areas in an order of their addresses when said testing means determined that said storage areas are abnormal.

14. The data storage system according to claim 4, wherein said second read control means, which reads data in a predetermined order, comprises means for successively reading data from said plurality of storage areas in an order of their storage address data such that said data is read in the order in which it was stored when said testing means determines that the data stored in a storage area contains an error.

* * * * *

UNITED STATES PATENT AND TRADEMARK OFFICE
CERTIFICATE OF CORRECTION

PATENT NO. : 5,523,915
DATED : June 4, 1996
INVENTOR(S) : KAMADA

It is certified that error appears in the above-indentified patent and that said Letters Patent is hereby corrected as shown below:

Title page, under Items [19] and [75], Inventor;

change "Kamuda" to --Kamada--

Signed and Sealed this

Tenth Day of December, 1996

Attest:

BRUCE LEHMAN

Attesting Officer

Commissioner of Patents and Trademarks